United States Patent
Komo et al.

(10) Patent No.: US 9,508,700 B2
(45) Date of Patent: Nov. 29, 2016

(54) SEMICONDUCTOR DEVICE MODULE WITH SOLDER LAYER

(71) Applicant: Mitsubishi Electric Corporation, Tokyo (JP)

(72) Inventors: Hideo Komo, Tokyo (JP); Takeshi Omaru, Tokyo (JP); Shoji Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/022,408

(22) PCT Filed: Dec. 4, 2013

(86) PCT No.: PCT/JP2013/082543
§ 371 (c)(1),
(2) Date: Mar. 16, 2016

(87) PCT Pub. No.: WO2015/083250
PCT Pub. Date: Jun. 11, 2015

(65) Prior Publication Data
US 2016/0233202 A1    Aug. 11, 2016

(51) Int. Cl.
*H01L 23/36* (2006.01)
*H02M 1/32* (2007.01)
(Continued)

(52) U.S. Cl.
CPC .............. *H01L 25/18* (2013.01); *H01L 23/00* (2013.01); *H01L 23/053* (2013.01); *H01L 23/34* (2013.01); *H01L 23/36* (2013.01); *H01L 23/3675* (2013.01); *H01L 23/3736* (2013.01); *H01L 23/4924* (2013.01); *H01L 23/552* (2013.01);
(Continued)

(58) Field of Classification Search
CPC .. H02M 1/08; H02M 1/32; H02M 2001/327; H01L 23/36
See application file for complete search history.

(56) References Cited

U.S. PATENT DOCUMENTS 5,446,318 A * 8/1995 Koike ................. H01L 23/3735
257/707
5,721,455 A * 2/1998 Takashita ................ H01L 23/34
257/177

(Continued)

FOREIGN PATENT DOCUMENTS

JP         05-251504 A     9/1993
JP       2003-009541 A     1/2003
(Continued)

OTHER PUBLICATIONS

International Search Report—PCT/JP2013/082543 mailed Mar. 11, 2014.

*Primary Examiner* — Evan Pert
(74) *Attorney, Agent, or Firm* — Studebaker & Brackett PC

(57) ABSTRACT

The present invention relates to a semiconductor device used in power equipment. The semiconductor device includes: a base plate; an insulating substrate mounted on the base plate; a power switching element bonded to the insulating substrate with a solder layer; and the base plate, the insulating substrate, and the power switching element forming a module, a control substrate located above the module. The control substrate includes a variable gate voltage circuit measuring a collector-emitter voltage of the power switching element and changing a gate voltage such that the power switching element is supplied with given target power determined by a product of the collector-emitter voltage and a collector current.

9 Claims, 17 Drawing Sheets

(51) Int. Cl.
*H01L 25/18* (2006.01)
*H02M 1/08* (2006.01)
*H01L 23/00* (2006.01)
*H03K 17/082* (2006.01)
*H01L 23/053* (2006.01)
*H01L 23/34* (2006.01)
*H01L 23/367* (2006.01)
*H01L 23/373* (2006.01)
*H01L 23/492* (2006.01)
*H01L 23/552* (2006.01)

(52) U.S. Cl.
CPC ............. *H01L 24/32* (2013.01); *H01L 24/33* (2013.01); *H01L 24/49* (2013.01); *H01L 24/73* (2013.01); *H02M 1/08* (2013.01); *H03K 17/0828* (2013.01); *H01L 2224/27013* (2013.01); *H01L 2224/32225* (2013.01); *H01L 2224/48091* (2013.01); *H01L 2224/48108* (2013.01); *H01L 2224/48137* (2013.01); *H01L 2224/48139* (2013.01); *H01L 2224/48175* (2013.01); *H01L 2224/48227* (2013.01); *H01L 2224/73265* (2013.01); *H01L 2224/83951* (2013.01); *H01L 2924/01013* (2013.01); *H01L 2924/01029* (2013.01); *H01L 2924/05032* (2013.01); *H01L 2924/05042* (2013.01); *H01L 2924/1033* (2013.01); *H01L 2924/10161* (2013.01); *H01L 2924/10254* (2013.01); *H01L 2924/10272* (2013.01); *H01L 2924/1203* (2013.01); *H01L 2924/1207* (2013.01); *H01L 2924/13055* (2013.01); *H01L 2924/13091* (2013.01); *H01L 2924/15747* (2013.01); *H01L 2924/15787* (2013.01); *H01L 2924/19107* (2013.01); *H01L 2924/20106* (2013.01); *H01L 2924/20107* (2013.01); *H01L 2924/20108* (2013.01); *H01L 2924/30101* (2013.01); *H02M 2001/325* (2013.01)

(56) References Cited

U.S. PATENT DOCUMENTS

| | | | |
|---|---|---|---|
| 6,707,671 | B2* | 3/2004 | Yamashita .......... H01L 23/3737 257/687 |
| 6,845,022 | B2 | 1/2005 | Yoshimura et al. |
| 7,081,671 | B2* | 7/2006 | Fukada ................. H01L 23/473 257/707 |
| 7,382,628 | B2 | 6/2008 | Kawamoto et al. |
| 7,671,465 | B2* | 3/2010 | Funakoshi .......... H01L 23/3735 257/706 |

FOREIGN PATENT DOCUMENTS

| | | |
|---|---|---|
| JP | 2004-103998 A | 4/2004 |
| JP | 2004-312817 A | 11/2004 |
| JP | 2009-070863 A | 4/2009 |

\* cited by examiner

F I G. 2
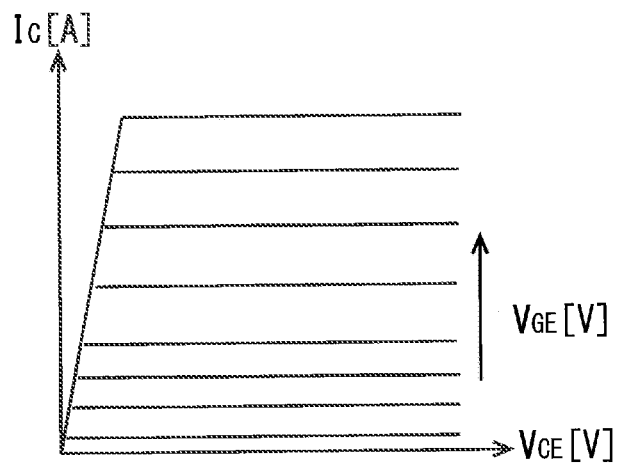

F I G . 9
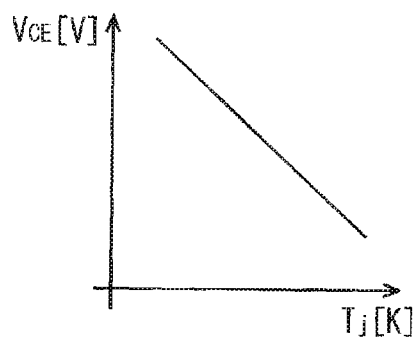
F I G . 1 0
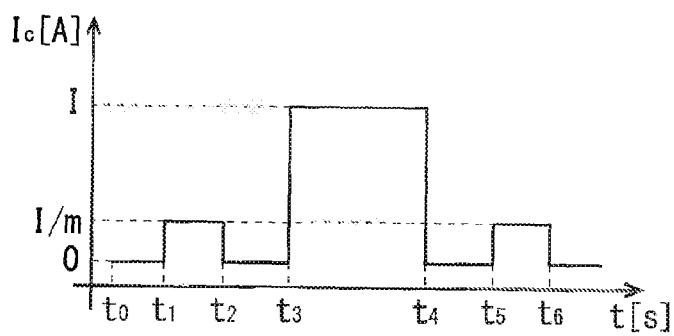
F I G . 1 1
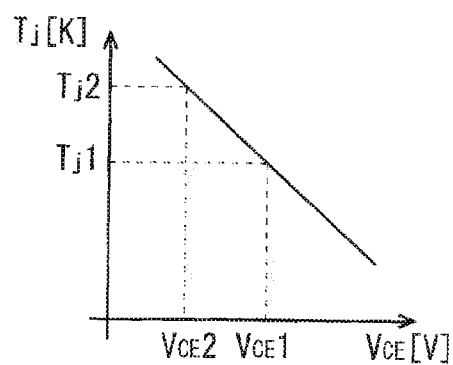

F I G. 1 2
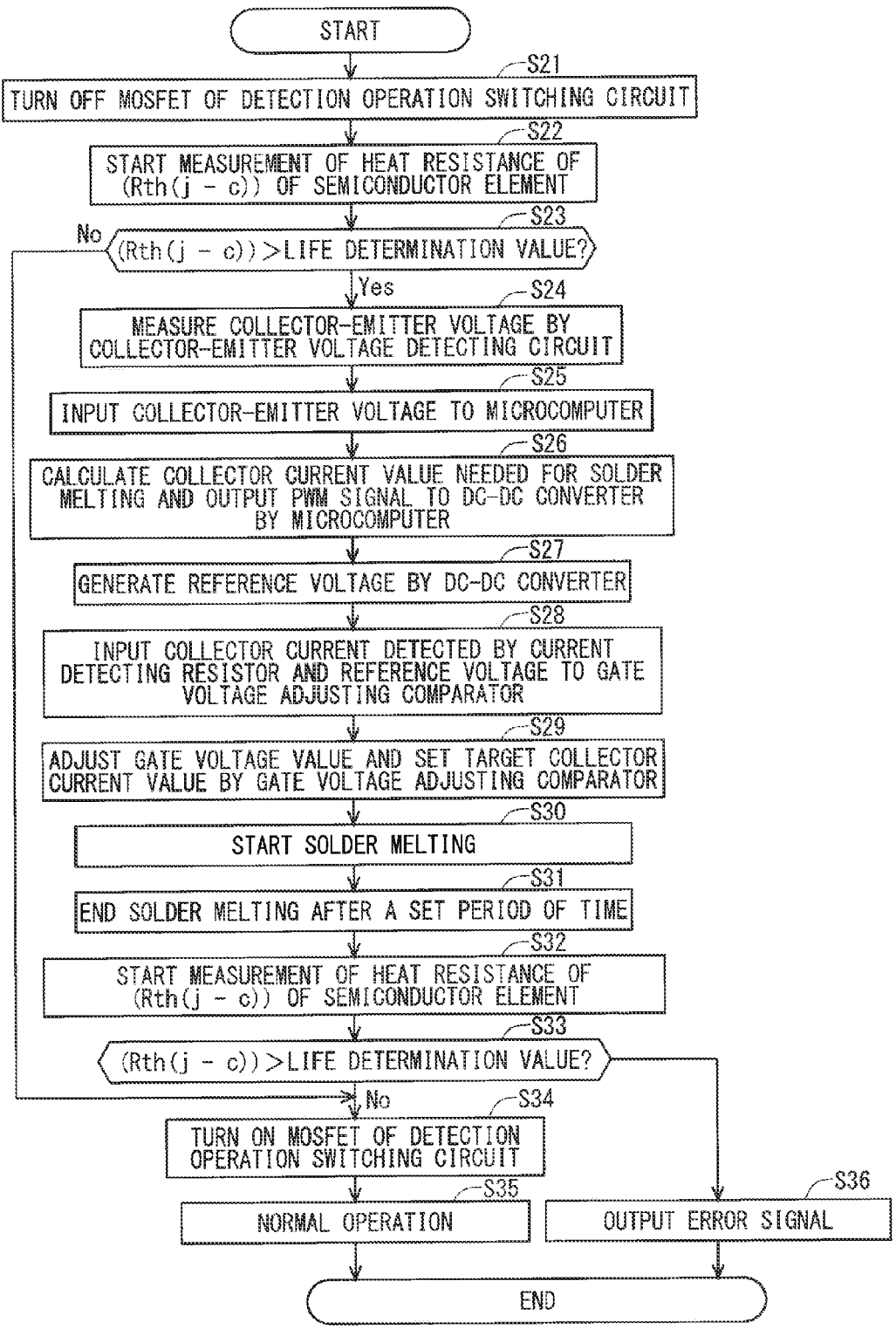

F I G . 1 6
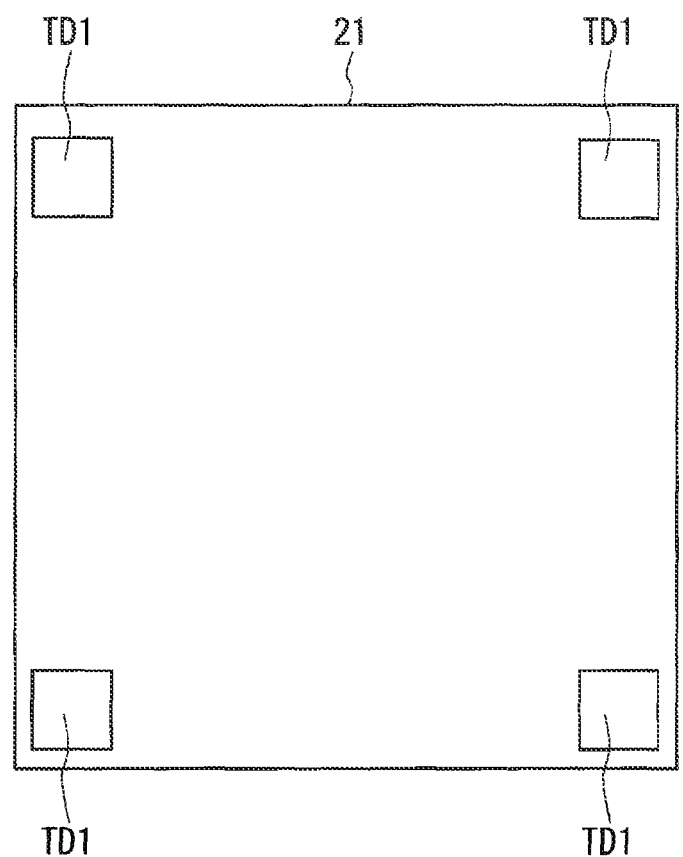

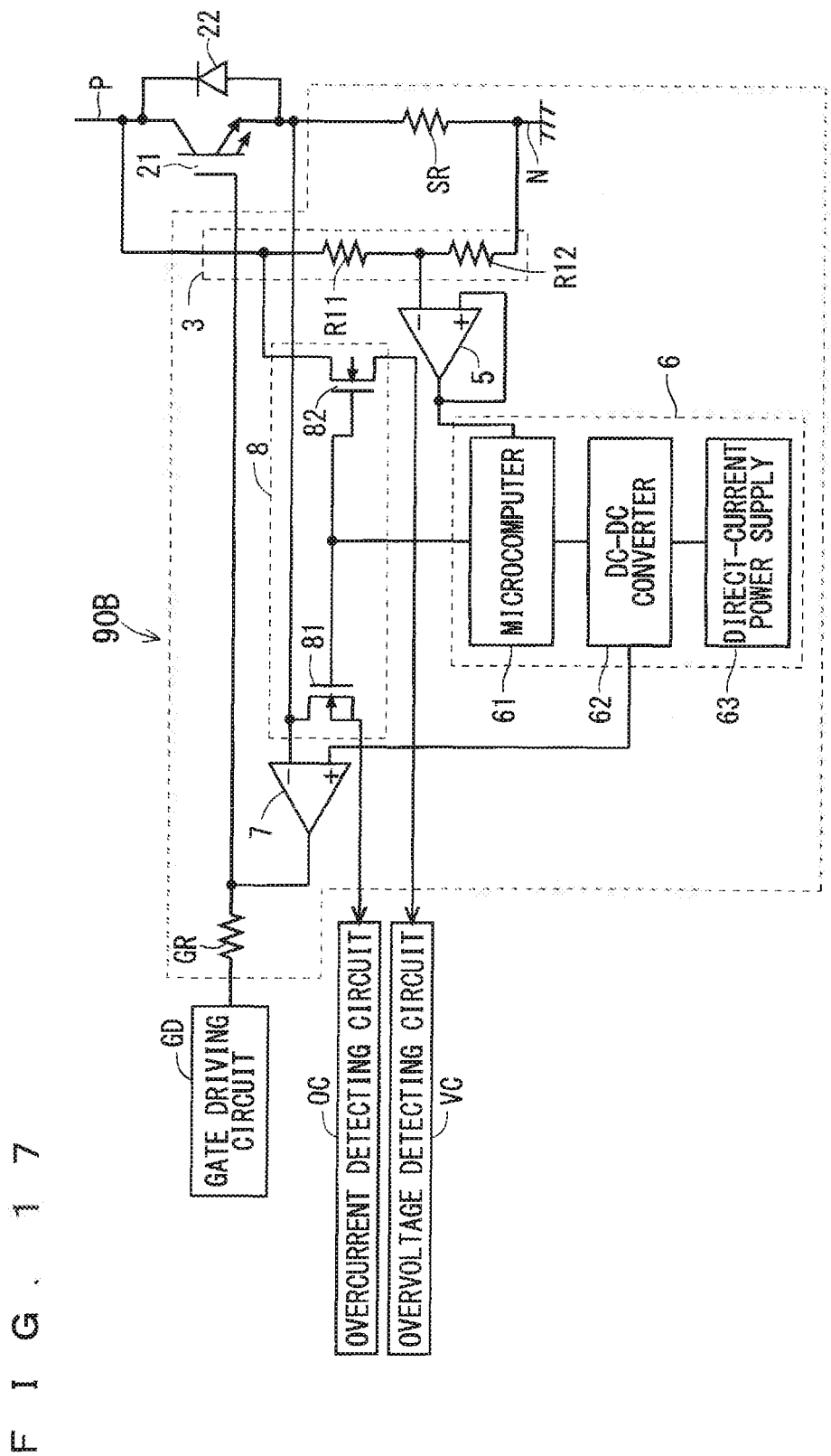
F I G . 1 7

F I G. 1 9
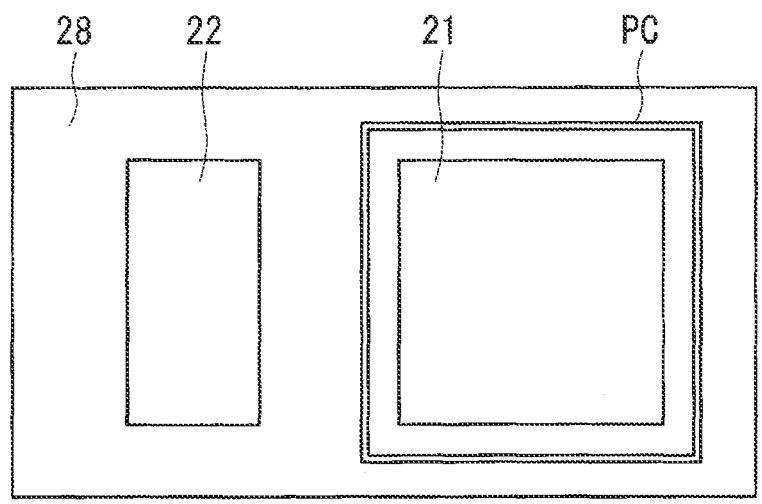

SEMICONDUCTOR DEVICE MODULE WITH SOLDER LAYER

TECHNICAL FIELD

The present invention relates to a semiconductor device, and more particularly, to a semiconductor device used in power equipment.

BACKGROUND ART

Conventional semiconductor devices used in power equipment have been known that solder cracks occur because heat generated when current flows through power semiconductor elements is applied as thermal stress to the power semiconductor elements, and thus stress is applied to solder portions provided on lower surfaces of the power semiconductor elements.

Progress of the solder cracks increases a heat resistance of the power semiconductor elements that exceeds the limits of heat resistance, possibly leading to breakage of the power semiconductor elements.

Patent Document 1 discloses as follows. A heat resistance of a power semiconductor element during on-off control is obtained by a computation, the product life of the power semiconductor element is determined on the basis of the obtained heat resistance, and a collector current value is controlled to be limited as necessary.

PRIOR ART DOCUMENT

Patent Document

Patent Document 1: Japanese Patent Application Laid-Open No. 2003-9541

SUMMARY OF INVENTION

Problems to be Solved by the Invention

In Patent Document 1 described above, the power semiconductor element is prevented from becoming unusable by determining the life of the power semiconductor element and limiting the collector current value, which limits the capacity of the semiconductor device.

The present invention has been made in view of the above mentioned problems, and an object thereof is to provide a semiconductor device capable of being continuously used without a limit to capacity of the semiconductor device even in a case where solder cracks occur in a solder layer being a lower surface of a power semiconductor element.

Means to Solve the Problems

A semiconductor device includes: a base plate; an insulating substrate mounted on the base plate; a power switching element bonded to the insulating substrate with a solder layer; and the base plate, the insulating substrate, and the power switching element forming a module, a control substrate located above the module. The control substrate includes a variable gate voltage circuit measuring a collector-emitter voltage of the power switching element and changing a gate voltage such that the power switching element is supplied with given target power determined by a product of the collector-emitter voltage and a collector current.

Effects of the Invention

In the semiconductor device above, the control substrate includes the variable gate voltage circuit, so that changing the gate voltage can change an amount of power applied to the power switching element, and controlling a heating value of the power switching element can control temperature of the power switching element. Thus, for example, in a case where cracks occur in the solder layer below the power switching element, the power switching element generates heat that melts the solder layer, to thereby self-repair the cracks.

BRIEF DESCRIPTION OF DRAWINGS

FIG. 2 is a diagram showing static characteristics of a power semiconductor element.

FIG. 9 is a diagram showing characteristics of a collector-emitter voltage in relation to a temperature change.

FIG. 10 is a diagram showing a timing chart of an adjustment to a gate voltage.

FIG. 11 is a diagram showing relationships among collector-emitter voltages and temperatures of a power semiconductor element.

FIG. 12 is a flowchart for describing a melting process in the second embodiment.

FIG. 16 is a diagram showing a configuration in which temperature detecting diodes are provided in four corners of an upper surface of the power semiconductor element.

FIG. 17 is a diagram for describing a configuration of a variable gate voltage circuit in a third embodiment.

FIG. 19 is a plan view showing the configuration of the semiconductor device in the fourth embodiment of the present invention.

DESCRIPTION OF EMBODIMENTS

First Embodiment

Configuration of Device

Figure 1:
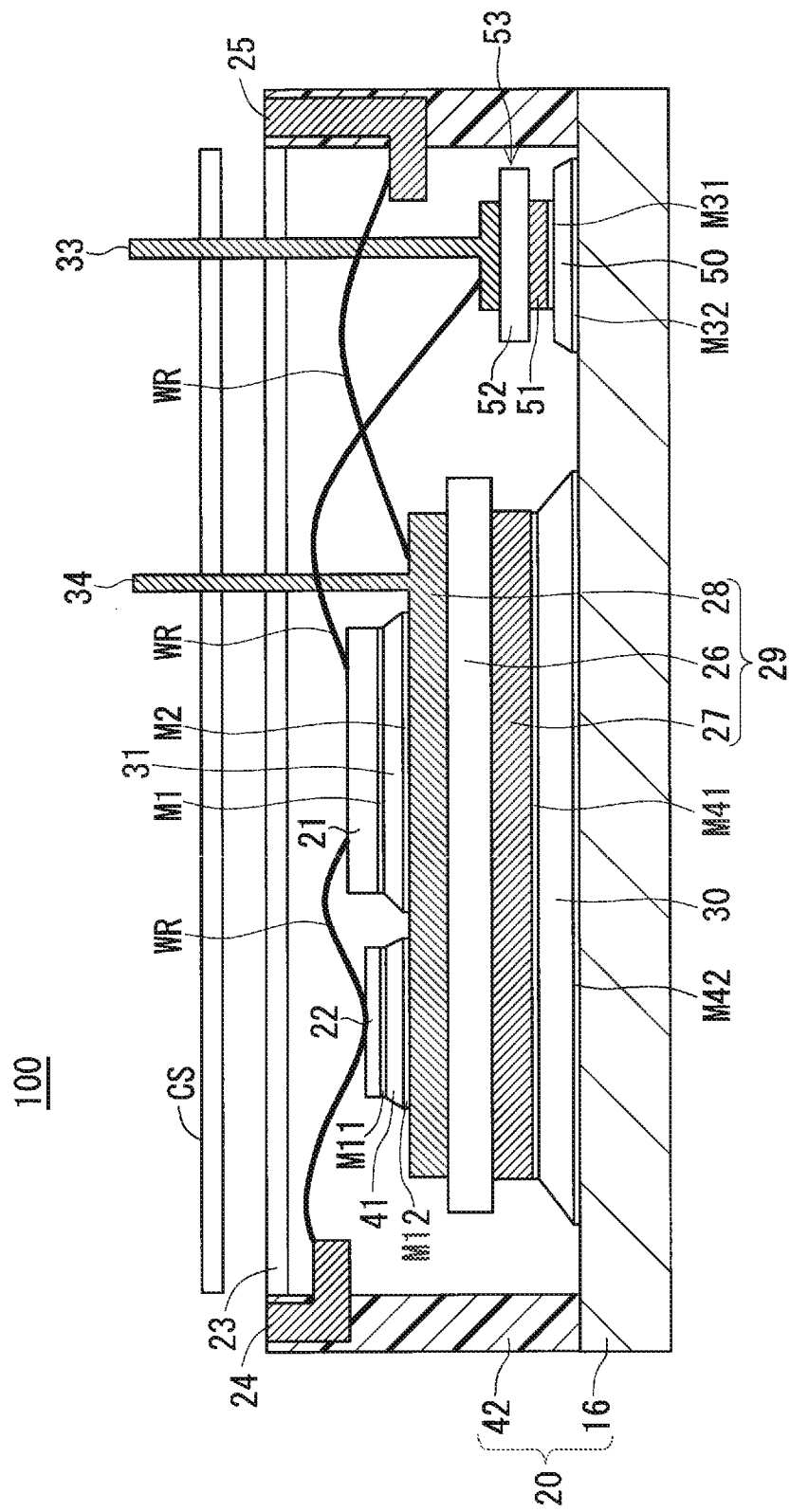
FIG. 1 is a cross-sectional view showing a configuration of a semiconductor device in a first embodiment of the present invention.

A first embodiment for a semiconductor device of the present invention is described with reference to FIGS. 1 to 6. FIG. 1 is a cross-sectional view showing a configuration of a semiconductor device 100 in the first embodiment of the present invention. In FIG. 1, an insulating substrate 29 is bonded to a main surface of a base plate 16 formed of a copper (Cu) material, an aluminum (Al) material, or an alloy material containing Cu as a main component.

The insulating substrate 29 includes aluminum nitride (AlN) or silicon nitride (SiN) as an insulating base material 26, and a conductive plate 27 made of, for example, Cu is disposed on a lower main surface of the insulating base material 26, namely, a main surface thereof facing the base plate 16.

A conductive plate 28 made of, for example, Cu is disposed on an upper main surface of the insulating base material 26, namely, a main surface opposite to the lower main surface thereof. The conductive plates 27, 28 are bonded to the insulating base material 26.

The insulating substrate 29 is bonded to a conductive pattern M42 disposed on the base plate 16 with a below-insulating-substrate solder layer 30 therebetween. More specifically, a conductive pattern M41 disposed on the lower main surface of the conductive plate 27 is bonded to the conductive pattern M42 with the below-insulating-substrate solder layer 30 therebetween, to thereby fix the insulating substrate 29 to the base plate 16.

A power semiconductor element 21 and a power semiconductor element 22 are respectively bonded to the conductive plate 28 with a below-semiconductor-element solder layer 31 and a below-semiconductor-element solder layer 41 therebetween. More specifically, a conductive pattern M2 disposed on an upper main surface of the conductive plate 28 is bonded to a conductive pattern M1 disposed on a lower main surface of the power semiconductor element 21 with the below-semiconductor-element solder layer 31 therebetween while a conductive pattern M12 disposed on the upper main surface of the conductive plate 28 is bonded to a conductive pattern M11 disposed on a lower main surface of the power semiconductor element 22 with the below-semiconductor-element solder layer 41 therebetween.

An insulating substrate 53 provided separately from the insulating substrate 29 is bonded to the main surface of the base plate 16.

The insulating substrate 53 includes MN or SiN as a ceramic base material 52, and a conductive plate 51 made of, for example, Cu is disposed on a lower main surface of the ceramic base material 52, namely, a main surface thereof facing the base plate 16.

A control terminal 33 is disposed on an upper main surface of the ceramic base material 52, namely, a main surface opposite to the lower main surface thereof. Herein, the conductive plate 51 and the control terminal 33 are bonded to the ceramic base material 52.

The insulating substrate 53 is bonded to a conductive pattern M32 disposed on the base plate 16 with a below-insulating-substrate solder layer 50 therebetween. More specifically, a conductive pattern M31 disposed on a lower main surface of the conductive plate 51 is bonded to the conductive pattern M32 with the below-insulating-substrate solder layer 50 therebetween, to thereby fix the insulating substrate 53 to the base plate 16.

The base plate 16 is surrounded by a resin case 42, and a package case 20 having the base plate 16 as a bottom surface and having an opening opposite to the bottom surface is formed.

A main electrode terminal 24 is buried inside a wall surface of the resin case 42 and has one end portion exposed from the inner wall surface of the resin case 42, the one end portion being electrically connected to a main electrode of the power semiconductor element 22 with an internal metal wire WR. In addition, the main electrode terminal 24 has another end portion exposed to the outside from a top end face of the wall surface of the resin case 42.

A main electrode terminal 25 (P-side main electrode terminal) is buried inside a wall surface opposite to the wall surface in which the main electrode terminal 24 (N-side main electrode terminal) is buried. The main electrode terminal 25 has one end portion exposed from the inner wall surface of the resin case 42, the one end portion being electrically connected to the conductive plate 28 with the internal metal wire WR. In addition, the main electrode terminal 25 has another end portion exposed to the outside from a top end face of the wall surface of the resin case 42.

The main electrode of the power semiconductor element 22 is electrically connected to a main electrode of the power semiconductor element 21 with the internal metal wire WR.

A gate electrode of the power semiconductor element 22 is electrically connected to the control terminal 33 with the internal metal wire WR. The control terminal 33 extends vertically to the main surface of the base plate 16 and penetrates a noise shielding plate 23 located so as to close the opening of the package case 20.

The noise shielding plate 23 is formed of a metal plate of Al, Cu, or the like. The power semiconductor elements 21, 22, and the like are packaged in a space surrounded by the package case 20 and the noise shielding plate 23, to thereby form a module.

A collector-emitter voltage output terminal 34 that extends vertically to the main surface of the conductive plate 28 and penetrates the noise shielding plate 23 is provided on the main surface of the conductive plate 28.

The control terminal 33 and the collector-emitter voltage output terminal 34 also penetrate a control substrate CS disposed above the noise shielding plate 23 and are each electrically connected to predetermined portions of a control circuit (not shown) mounted on the control substrate CS.

Moreover, not only the control terminal 33 but also a plurality of signal terminals are disposed on the ceramic base material 52. The plurality of signal terminals extend vertically to the main surface of the base plate 16 and penetrate the noise shielding plate 23 and the control substrate CS to be each electrically connected to predetermined portions of the control circuit similarly to the control terminal 33, but the plurality of signal terminals are not shown.

Hereinafter, descriptions are given on the assumption that the semiconductor device 100 is a semiconductor device applied to an inverter, the power semiconductor element 21 is a switching element such as an insulated gate bipolar transistor (IGBT), and the power semiconductor element 22 is a diode element functioning as a freewheeling diode.

FIG. 2 is a diagram showing static characteristics of the power semiconductor element 21, the horizontal axis indicating a collector-emitter voltage $V_{CE}$, the vertical axis indicating a collector current $I_C$.

An amount of power applied to the power semiconductor element 21 is determined by a product of the collector current $I_C$ and the collector-emitter voltage $V_{CE}$, a gate voltage $V_{GE}$ with static characteristics shown in FIG. 2 being a parameter of the collector current $I_C$.

In the semiconductor device 100, the control circuit mounted on the control substrate CS includes a variable gate voltage circuit, so that changing the gate voltage $V_{GE}$ can freely change the amount of power applied to the power semiconductor element 21, and controlling a heating value of the power semiconductor element 21 can control temperature of the power semiconductor element 21.

Figure 3:
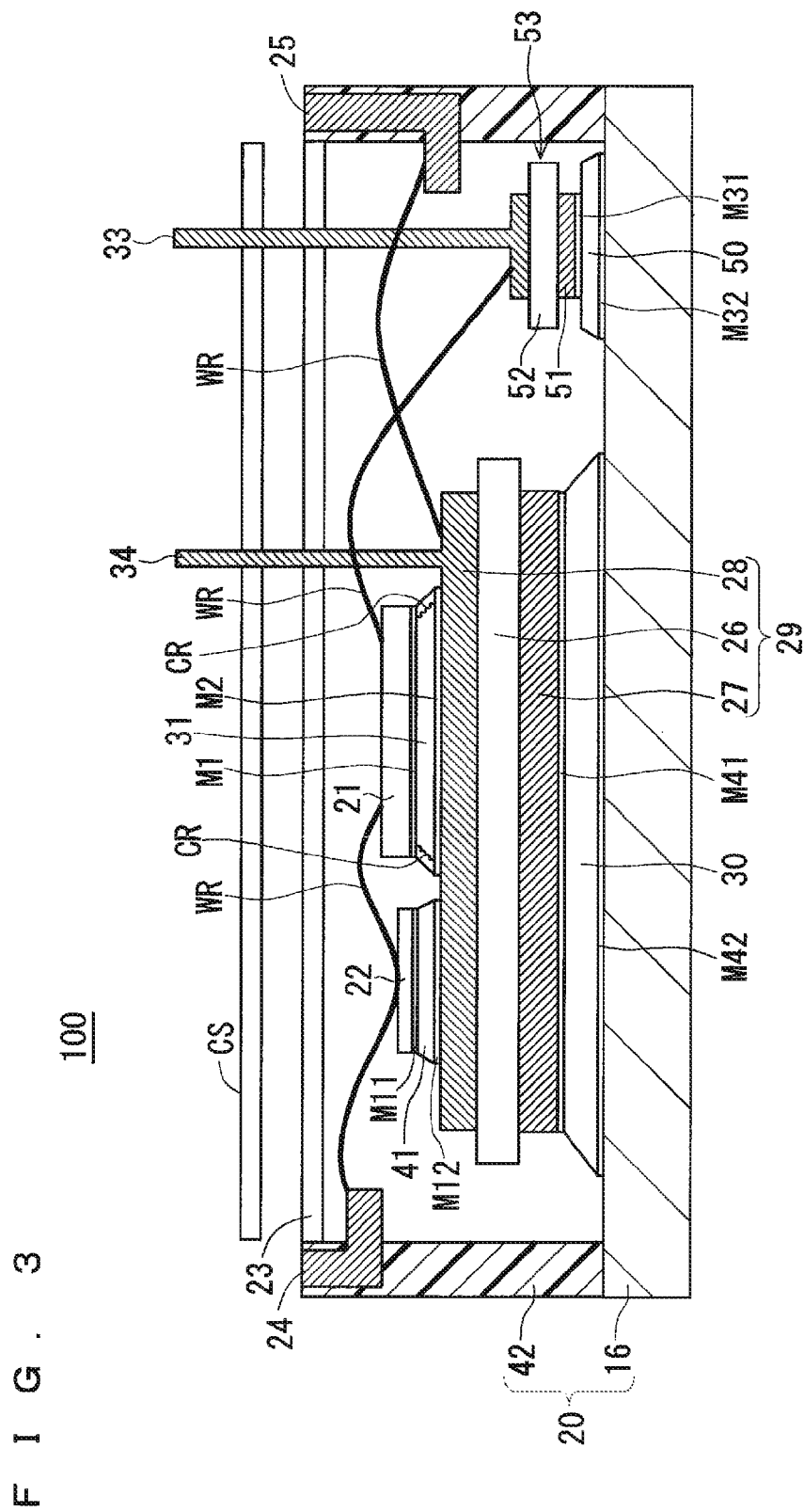
FIG. 3 is a cross-sectional view for describing self-repair operations for solder cracks.
Figure 4:
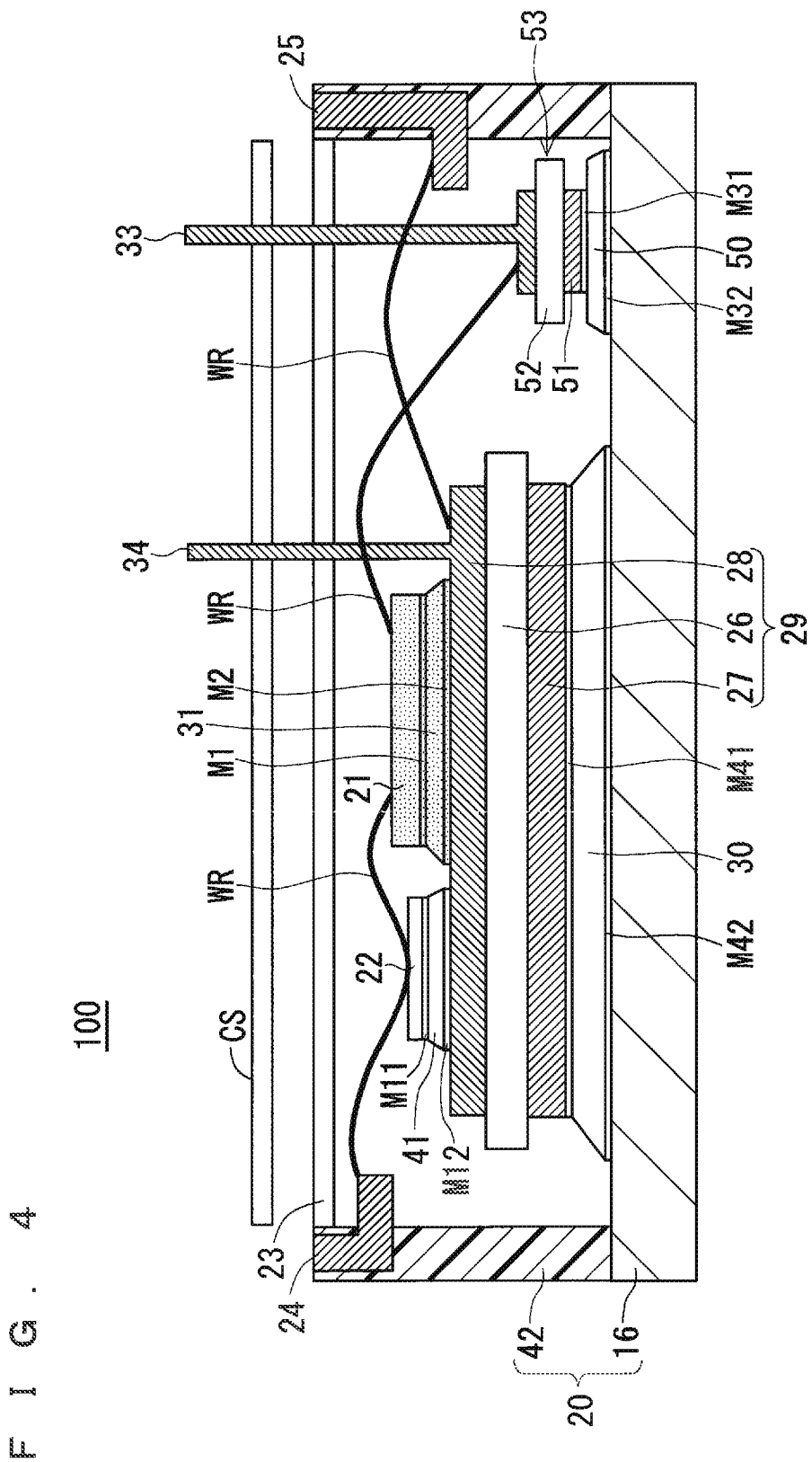
FIG. 4 is a cross-sectional view for describing the self-repair operations for the solder cracks.

As a result of the control, even in a case where cracks CR occur in the below-semiconductor-element solder layer 31 as shown in FIG. 3, applying the gate voltage controlled by the variable gate voltage circuit to the power semiconductor element 21 generates heat in the power semiconductor element 21 greater than heat in normal operations as shown in FIG. 4. Then, the generated heat melts the below-semiconductor-element solder layer 31, which subsequently solidifies, to thereby self-repair the solder cracks. This can prolong the product life of the semiconductor device 100.

In addition, to melt the below-semiconductor-element solder layer 31 by the technique described above, the below-semiconductor-element solder layer 31 needs to be made of lead-free solder having a melting point of approximately 200 to 300° C., and the temperature of the power semiconductor element 21 needs to be set accordingly.

Next, a configuration of a variable gate voltage circuit 90 mounted on the control substrate CS is described with reference to FIG. 5.

To supply the power semiconductor element 21 with given target power, the variable gate voltage circuit 90 measures a collector-emitter voltage and changes a gate voltage that changes a collector current value causing power to reach the target power.

Figure 5:
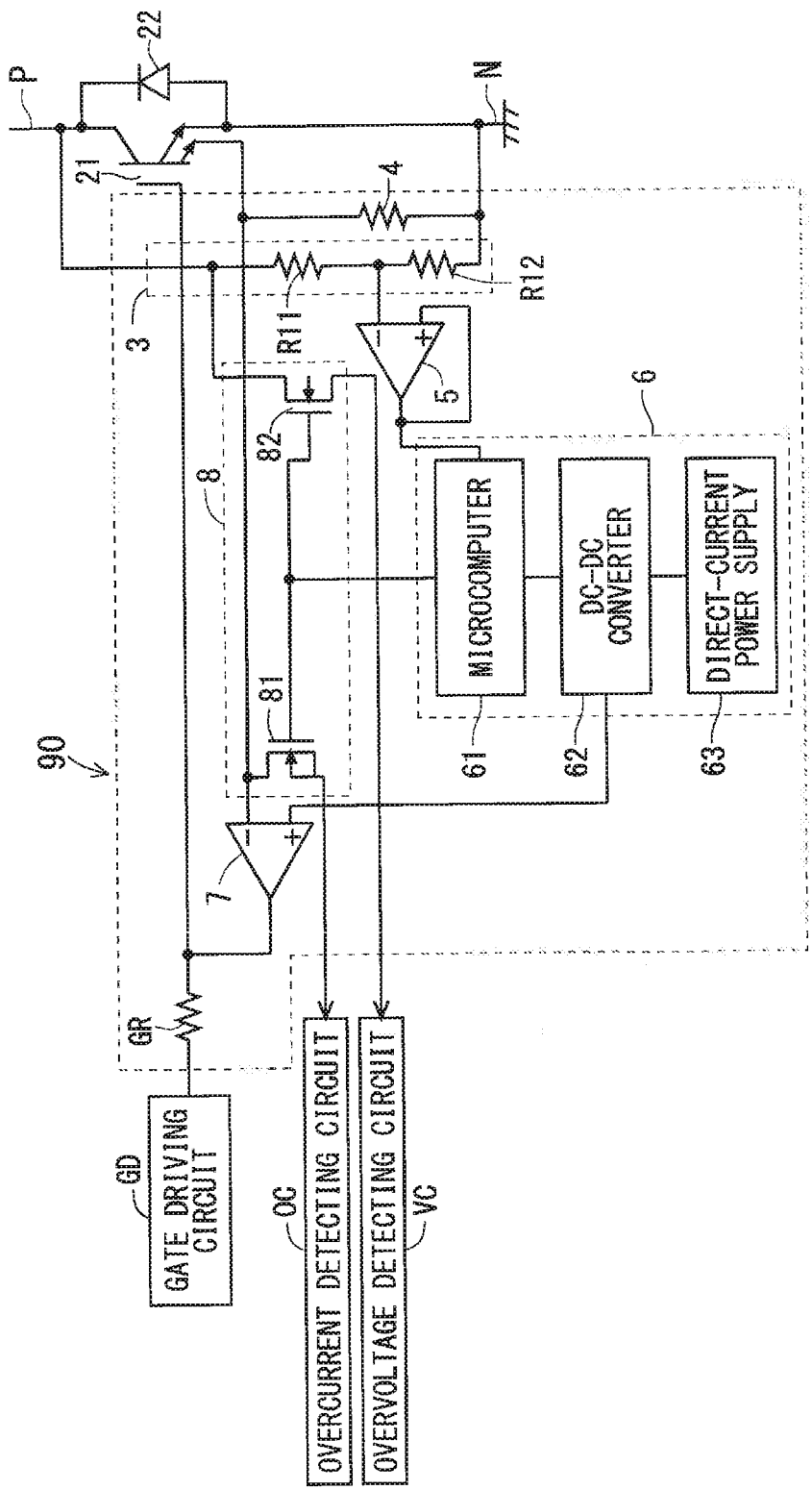
FIG. 5 is a diagram for describing a configuration of a variable gate voltage circuit in the first embodiment.

As shown in FIG. 5, an IGBT being the power semiconductor element 21 is connected between a power line P and a ground line N, and a freewheeling diode being the power semiconductor element 22 is connected therebetween in anti-parallel to the IGBT. The variable gate voltage circuit 90 changes power applied to a gate of the IGBT.

As shown in FIG. 5, the variable gate voltage circuit 90 includes a gate resistor GR connected to the gate of the power semiconductor element 21, a collector-emitter voltage detecting circuit 3, a current detecting resistor 4, a buffer amplifier 5, a variable reference voltage circuit 6, a gate voltage adjusting comparator 7, and a detection operation switching circuit 8.

The collector-emitter voltage detecting circuit 3 includes a resistor R11 and a resistor R12 connected in series between a collector and an emitter of the power semiconductor element 21, and both of the resistors R11 and R12 have a connection node connected to an inverting input (−) of the buffer amplifier 5.

An output of the buffer amplifier 5 is connected to a noninverting input (+) thereof and is also provided to a microcomputer 61 of the variable reference voltage circuit 6.

The variable reference voltage circuit 6 includes the microcomputer 61, a DC-DC converter 62, and a direct-current power supply 63.

The microcomputer 61 receives an output from the buffer amplifier 5, controls the DC-DC converter 62 based on a collector-emitter voltage, and adjusts an output from the DC-DC converter 62. The microcomputer 61 also performs on-off control of the detection operation switching circuit 8 based on the collector-emitter voltage.

The DC-DC converter 62 is supplied with power from the direct-current power supply 63, generates a direct-current reference voltage based on a pulse width modulation (PWM) signal from the microcomputer 61, and provides the direct-current reference voltage to a noninverting input (+) of the gate voltage adjusting comparator 7.

The gate voltage adjusting comparator 7 receives, from an inverting input (−), an emitter current (provided as a voltage value) detected by the current detecting resistor 4 connected between a current detecting emitter and the ground line N of the power semiconductor element 21. The gate voltage adjusting comparator 7 then compares the emitter current to the output of variable reference voltage circuit 6 and adjusts a gate voltage to set a collector current to a target value.

In addition, wiring for connecting the current detecting emitter and the current detecting resistor 4 is not shown in FIG. 1, but the wiring is connected to any of the plurality of signal terminals located on the ceramic base material 52, as described above, and is included in the control substrate CS.

The detection operation switching circuit 8 includes a MOSFET 81 and a MOSFET 82, the MOSFET 81 selecting whether to provide an emitter current detected by the current detecting resistor 4 to an overcurrent detecting circuit OC used during normal operations of the power semiconductor element 21 or to provide the emitter current to the gate voltage adjusting comparator 7, the MOSFET 82 selecting whether or not to provide a collector voltage detected by the collector-emitter voltage detecting circuit 3 to an overvoltage detecting circuit VC used during the normal operations of the power semiconductor element 21. The MOSFET 81 and the MOSFET 82 have gates provided with a control signal from the variable reference voltage circuit 6.

Here, the collector-emitter voltage output terminal 34 is the terminal for connecting the collector of the power semiconductor element 21 and the collector-emitter voltage detecting circuit 3.

The gate resistor GR is connected to a gate driving circuit GD, and the gate of the power semiconductor element 21 is provided with a gate signal from the gate driving circuit GD during the normal operations of the power semiconductor element 21 and is provided with a gate signal from the gate voltage adjusting comparator 7 during operations of the variable gate voltage circuit 90.

<Operations of Device>

Figure 6:
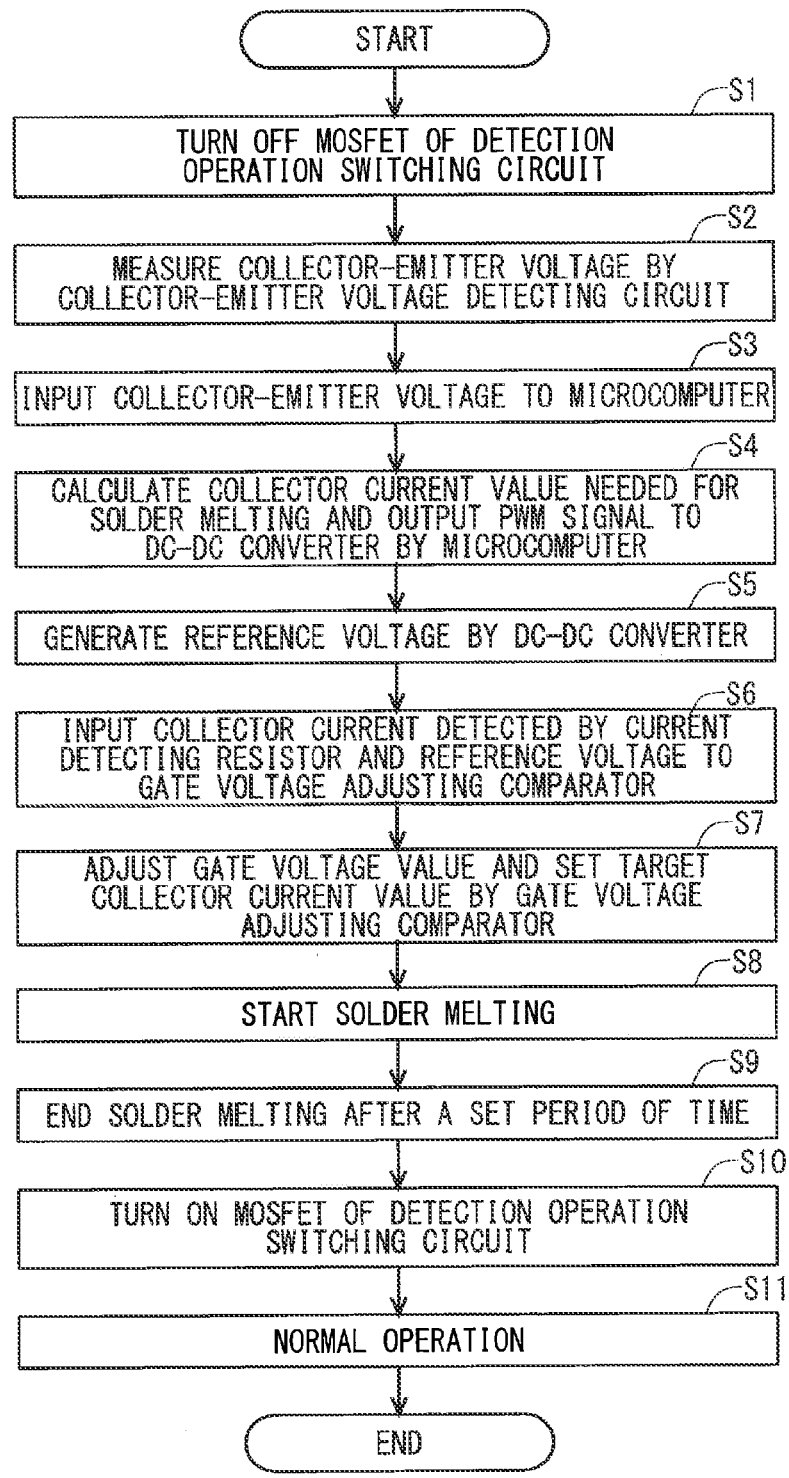
FIG. 6 is a flowchart for describing a solder melting process in the first embodiment.

The self-repair operations (solder melting process) for the solder cracks in the semiconductor device 100 including the variable gate voltage circuit 90 described above are described with a flowchart shown in FIG. 6 and with reference to FIGS. 1 and 5.

When the semiconductor device 100 starts operating, first, the MOSFETs 81, 82 of the detection operation switching circuit 8 are turned OFF (Step S1) so as to prevent the overcurrent detecting circuit OC and the overvoltage detecting circuit VC from each performing detection operations while allowing the gate voltage adjusting comparator 7 to perform comparison operations.

In the solder melting process, first, the collector-emitter voltage detecting circuit 3 of the variable gate voltage circuit 90 measures a collector-emitter voltage of the power semiconductor element 21 (Step S2).

Then, the obtained collector-emitter voltage is input to the microcomputer 61 of the variable reference voltage circuit 6 through the buffer amplifier 5 (Step S3).

The microcomputer 61 calculates a collector current value needed for solder-melting the below-semiconductor-element solder layer 31 of the power semiconductor element 21 and outputs, to the DC-DC converter 62, a PWM signal for generating a reference voltage such that the gate voltage adjusting comparator 7 can output a gate voltage from which the collector current value can be obtained (Step S4).

The DC-DC converter 62 generates, based on the PWM signal from the microcomputer 61, the reference voltage such that the gate voltage adjusting comparator 7 can output the gate voltage from which the collector current value needed for solder melting can be obtained (Step S5).

Then, the reference voltage output from the variable reference voltage circuit 6 and an emitter current (provided as a voltage value and hereinafter referred to as a collector current) detected by the current detecting resistor 4 are input to the gate voltage adjusting comparator 7 (Step S6).

The gate voltage adjusting comparator 7 compares the collector current value to the reference voltage. In a case where the collector current value has not reached the target value needed for solder melting, the gate voltage being an output is increased to increase the collector current value, and power applied to the power semiconductor element 21 is thus increased. On the other hand, in a case where the collector current value has reached the target value needed for solder melting, the gate voltage is adjusted to maintain the gate voltage (Step S7).

When the collector current value reaches the target value, power reaches the target power for solder melting and time measurement starts, assuming that the solder melting starts (Step S8).

After a predetermined period of time, the solder melting process is ended by reducing the gate voltage to a voltage in a state of normal operations or by temporarily stopping the solder melting process (Step S9).

Subsequently, the MOSFETs 81, 82 of the detection operation switching circuit 8 are turned ON in Step S10 so as to cause the overcurrent detecting circuit OC and the overvoltage detecting circuit VC to each perform the detection operations while preventing the gate voltage adjusting comparator 7 from performing the comparison operations. After that, the normal operations are maintained until the semiconductor device 100 stops (Step S11).

As described above, in the semiconductor device 100 in the first embodiment of the present invention, the control circuit mounted on the control substrate CS includes the variable gate voltage circuit, so that changing the gate voltage can change the amount of power applied to the power semiconductor element 21, and controlling the heating value of the power semiconductor element 21 can control the temperature of the power semiconductor element 21.

As a result of the control, even in the case where the cracks occur in the below-semiconductor-element solder layer 31, applying the gate voltage controlled by the variable gate voltage circuit to the power semiconductor element 21 generates the heat in the power semiconductor element 21 greater than the heat in the normal operations. Then, the generated heat melts the below-semiconductor-element solder layer 31, which subsequently solidifies, and thus the solder cracks can be removed. This can prolong the product life of the semiconductor device 100.

Whether or not the cracks occur in the below-semiconductor-element solder layer 31 cannot be directly determined from the outside, but in a case where power losses by estimating currents and voltage waveforms of the power semiconductor element 21 are abruptly increased, occurrence of cracks is suspected, so that performing the solder melting process is effective.

Second Embodiment

A second embodiment for a semiconductor device of the present invention is described with reference to FIGS. 7 to 11.

<Configuration of Device>

Figure 7:
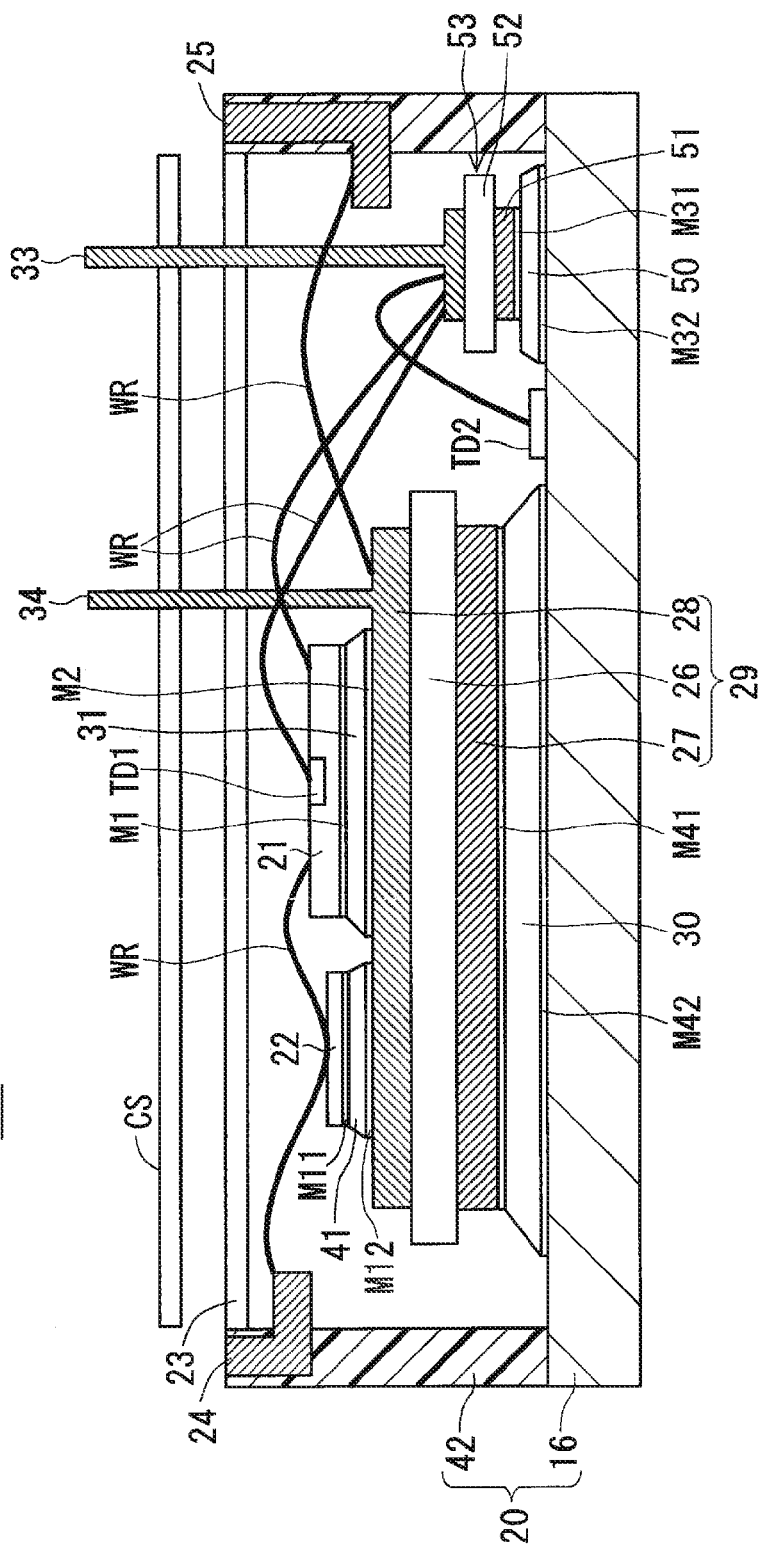
FIG. 7 is a cross-sectional view showing a configuration of a semiconductor device in a second embodiment of the present invention.

FIG. 7 is a cross-sectional view showing a configuration of a semiconductor device 200 in the second embodiment of the present invention. In FIG. 7, the same components as those of the semiconductor device 100 described with reference to FIG. 1 are denoted by the same references, and redundant descriptions are omitted.

As shown in FIG. 7, the semiconductor device 200 includes a temperature detecting diode TD1 (first temperature detecting element) disposed on the upper surface of the power semiconductor element 21 and includes a temperature detector TD2 (second temperature detecting element) disposed on the main surface of the base plate 16 in the package case 20, the temperature detector TD2 being formed of, for example, a thermistor.

Outputs of the temperature detecting diode TD1 and the temperature detector TD2 are each connected to a plurality of signal terminals, which are not shown, located on the ceramic base material 52 through corresponding internal metal wires WR.

Figure 8:
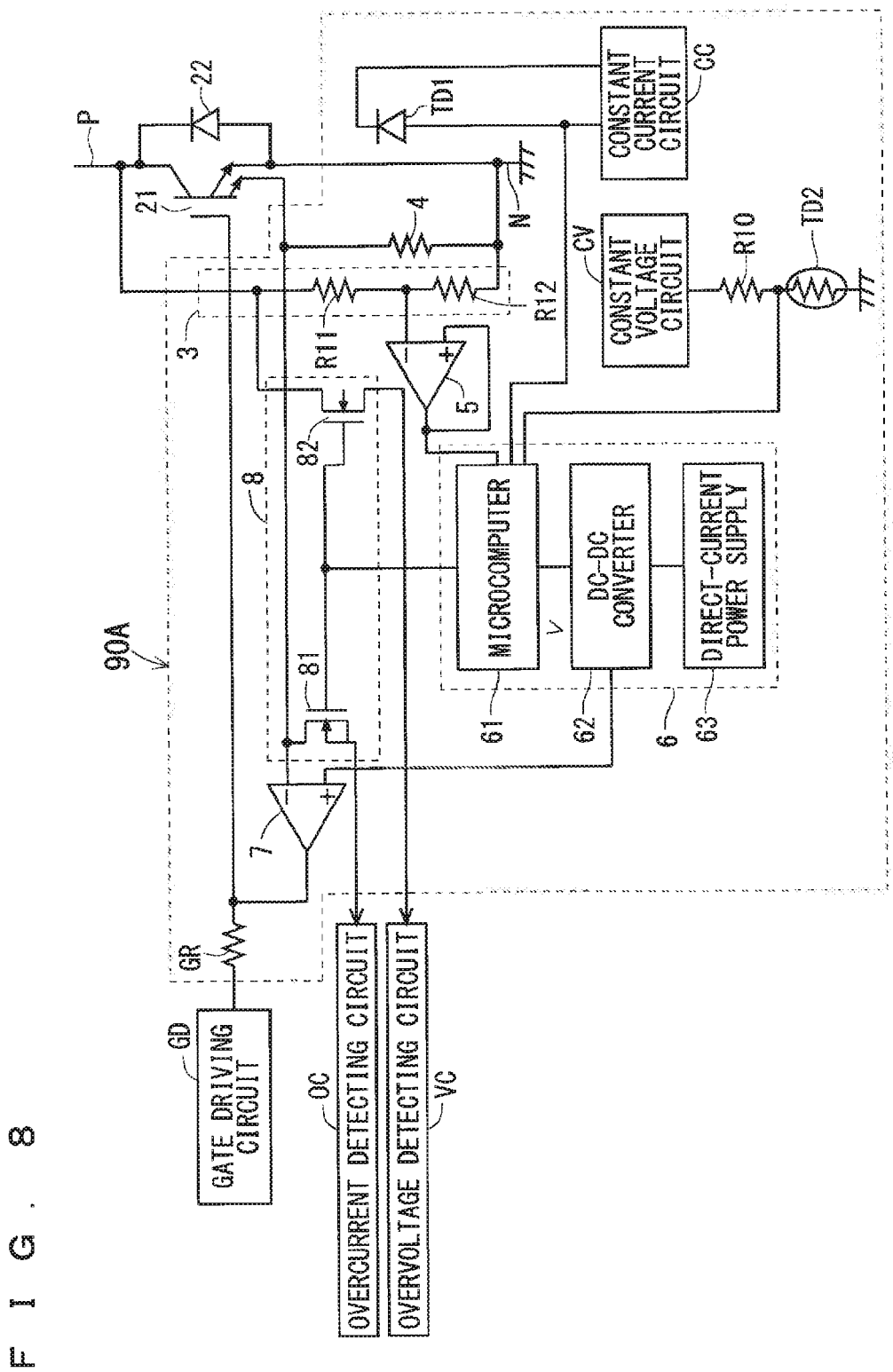
FIG. 8 is a diagram for describing a configuration of a variable gate voltage circuit in the second embodiment.

Next, a configuration of a variable gate voltage circuit 90A mounted on the control substrate CS is described with reference to FIG. 8. In FIG. 8, the same components as those of the variable gate voltage circuit 90 described with reference to FIG. 5 are denoted by the same references, and redundant descriptions are omitted.

To supply the power semiconductor element 21 with target power, the variable gate voltage circuit 90A measures a collector-emitter voltage and changes a gate voltage that changes a collector current value causing power to reach the target power. The variable gate voltage circuit 90A calculates a heat resistance of a lower portion of the power semiconductor element 21 based on the outputs of the temperature detecting diode TD1 and the temperature detector TD2 and also has the function of determining whether or not the solder melting process is needed based on the heat resistance.

As shown in FIG. 8, the variable gate voltage circuit 90A includes a constant current circuit CC connected to the temperature detecting diode TD1 and a constant voltage circuit CV connected to the temperature detector TD2 in addition to the configuration of the variable gate voltage circuit 90 shown in FIG. 5.

The temperature detecting diode TD1 has a resistance changed according to temperature, so that the temperature detecting diode TD1 supplied with a constant current from the constant current circuit CC outputs a voltage value corresponding to a detected temperature. The temperature detecting diode TD1 is disposed on the power semiconductor element 21, allowing detection of a value extremely close to a temperature of the power semiconductor element 21.

An output node is located on an anode side of the temperature detecting diode TD1, and an output from the output node is input to the microcomputer 61 of the variable reference voltage circuit 6.

The temperature detector TD2 is supplied with a constant voltage from the constant voltage circuit CV and is connected in series between the constant voltage circuit CV and a ground potential through a resistor R10.

The resistor R10 is located to linearize output voltage characteristics. A connection node between the resistor R10 and the temperature detector TD2 is an output node, and an output from the output node is input to the microcomputer 61 of the variable reference voltage circuit 6.

<Operations of Device>

Next, a technique for calculating a heat resistance of the lower portion of the power semiconductor element 21 to determine whether or not the solder melting process is needed is described with reference to FIGS. 9 to 11. In the following description, a heat resistance of the lower portion of the power semiconductor element 21 is calculated using ΔVCE (sat).

ΔVCE (sat) is a technique for calculating a heat resistance of a lower surface of a semiconductor element from a difference in collector-emitter voltage before and after the semiconductor element is supplied with a constant collector current for a predetermined period of time when a current flows through the semiconductor element.

First, the temperature detecting diode TD1 measures a change in temperature of the element while a gate voltage is adjusted such that a constant collector current (whose value may select a collector current value during normal operations) flows through the power semiconductor element 21 in advance, and a collector-emitter voltage in relation to the change in temperature is recorded in the microcomputer 61 of the variable reference voltage circuit 6. The microcomputer 61 includes a recording unit such as a memory.

FIG. 9 shows an example of the temperature characteristics obtained in such manner. In FIG. 9, the horizontal axis indicates temperature $T_j$ (K), and the vertical axis indicates collector-emitter voltage $V_{CE}$ (V). In FIG. 9, the collector-emitter $V_{CE}$ decreases as the temperature increases.

Next, the difference in the collector-emitter voltage before and after the constant collector current is supplied for the predetermined period of time is determined. FIG. 10 shows a timing chart in which periods of times $t_0$ to $t_6$ are divided into periods of times $t_0$ to $t_1$, times $t_1$ to $t_2$, times $t_2$ to $t_3$, times $t_3$ to $t_4$, times $t_4$ to $t_5$, and times $t_5$ to $t_6$, a gate voltage is adjusted such that a constant collector current I (whose value may be a collector current value flowing to obtain the characteristics in FIG. 9 and may be greater or lower than that) flows during the times $t_3$ to $t_4$, and, in contrast, a gate voltage is adjusted such that a current of I/m (in which m is a whole number) flows during the times $t_1$ to $t_2$ and the times $t_5$ to $t_6$.

The microcomputer 61 records collector-emitter voltages $V_{CE1}$, $V_{CE2}$ during the respective periods of the times $t_1$ to $t_2$ and the times $t_5$ to $t_6$ when the collector current of I/m flows according to the timing chart.

Then, a temperature $T_j1$ and a temperature $T_j2$ of the power semiconductor element 21 respectively corresponding to the collector-emitter voltage $V_{CE1}$ and the collector-emitter voltage $V_{CE2}$ that have been obtained are determined from the temperature characteristics shown in FIG. 9, and a temperature difference $T_j2-T_j1$ caused by passing the collector current I is calculated. FIG. 11 shows the relationships between the collector-emitter voltage $V_{CE1}$ and the temperature $T_j1$ and the collector-emitter voltage $V_{CE2}$ and the temperature $T_j2$ that have been determined in such manner. In FIG. 11, the horizontal axis indicates a collector-emitter voltage, and the vertical axis indicates temperature of the power semiconductor element 21.

Moreover, the temperature detector TD2 disposed on the main surface of the base plate 16 measures temperature of the package case 20 to obtain a case temperature $T_c1$ in the time $t_2$ and a case temperature $T_c2$ in the time $t_6$, which are recorded in the microcomputer 61.

Then, the microcomputer 61 calculates the heat resistance of the lower portion of the power semiconductor element 21 from expression (1) below based on information of the temperatures $T_j1$ and $T_j2$ of the power semiconductor element 21, the temperatures $T_c1$ and $T_c2$ of the package case 20, the collector current I, the collector-emitter voltage $V_{CE}$ when the collector current I flows, and a period $(t_4-t_3)$ in which the collector current I flows.

$$\text{Heat Resistance [K/W]} = \frac{(T_j2 - T_j1) - (T_c2 - T_c1)}{I \times V_{CE} \times (t_4 - t_3)} \quad (1)$$

In a case where the heat resistance obtained by the technique above is greater than a predetermined threshold value, the solder melting process starts.

The microcomputer 61 in the variable reference voltage circuit 6 in the variable gate voltage circuit 90A adjusts control of the collector current when the measurement of the heat resistance similarly to the solder melting process.

As described above, the heat resistance of the lower portion of the power semiconductor element 21 is calculated using ΔVCE (sat), allowing an accurate determination of whether or not the solder melting process is needed.

Hereinafter, self-repair operations for solder cracks in the semiconductor device 200 including the variable gate voltage circuit 90A are described with a flowchart shown in FIG. 12 and with reference to FIGS. 7 and 8.

When the semiconductor device 200 starts operating, first, the MOSFETs 81, 82 of the detection operation switching circuit 8 are turned OFF (Step S21) so as to prevent the overcurrent detecting circuit OC and the overvoltage detecting circuit VC from each performing detection operations while allowing the gate voltage adjusting comparator 7 to perform comparison operations.

Next, a measurement of a heat resistance of the lower portion of the power semiconductor element 21 starts (Step S22). The heat resistance is a heat resistance (Rth (j–c)) between a junction (channel) of the power semiconductor element 21 and the resin case 42 and is calculated using ΔVCE (sat) based on outputs of the temperature detecting diode TD1 and the temperature detector TD2.

Next, the obtained Rth (j–c) is compared to a predetermined threshold value (Step S23). Then, in a case where it is determined that Rth (j–c) is greater than the threshold value, the solder melting process from Step S24 and the following steps is performed. If Rth (j–c) is less than or equal to the threshold value, proceed to Step S34.

Herein, the case in which Rth (j–c) is greater than the threshold value indicates a state where solder cracks occur in the below-semiconductor-element solder layer 31 (FIG. 7) of the power semiconductor element 21 and the heat resistance increases, and if the state is left unchanged, the life of the power semiconductor element 21 may be shortened. Therefore, the threshold value may be referred to as a life determination value of the power semiconductor element 21.

In addition, the processes of Steps S21 to S23 described above are performed in the variable gate voltage circuit 90A mounted on the control substrate CS (FIG. 7).

When the process proceeds to the solder melting process, first, the collector-emitter voltage detecting circuit 3 of the variable gate voltage circuit 90A measures a collector-emitter voltage of the power semiconductor element 21 (Step S24).

Then, the obtained collector-emitter voltage is input to the microcomputer 61 of the variable reference voltage circuit 6 through the buffer amplifier 5 (Step S25).

The microcomputer 61 calculates a collector current value needed for solder-melting the below-semiconductor-element solder layer 31 of the power semiconductor element 21 and outputs, to the DC-DC converter 62, a PWM signal for generating a reference voltage such that the gate voltage adjusting comparator 7 can output a gate voltage from which the collector current value can be obtained (Step S26).

The DC-DC converter 62 generates, based on the PWM signal from the microcomputer 61, the reference voltage such that the gate voltage adjusting comparator 7 can output the gate voltage from which the collector current value needed for solder melting can be obtained (Step S27).

Then, the reference voltage output from the variable reference voltage circuit 6 and an emitter current (almost equal to a collector current and provided as a voltage value) detected by the current detecting resistor 4 are input to the gate voltage adjusting comparator 7 (Step S28).

The gate voltage adjusting comparator 7 compares the collector current value to the reference voltage. In a case where the collector current value has not reached the target value needed for solder melting, the gate voltage being an output is increased to increase the collector current value, and power applied to the power semiconductor element 21 is thus increased. On the other hand, in a case where the collector current value has reached the target value needed for solder melting, the gate voltage is adjusted to maintain the gate voltage (Step S29).

When the collector current value reaches the target value, time measurement starts, assuming that the solder melting starts (Step S30).

After a predetermined period of time, the solder melting process is ended by reducing the gate voltage to a voltage in a state of normal operations or by temporarily stopping the solder melting process (Step S31).

Subsequently, when the solder solidifies, the power semiconductor element 21 is driven by the gate voltage in the normal operations to start a measurement of the heat resistance of the lower portion of the power semiconductor element 21 (Step S32).

Next, the obtained Rth (j–c) is compared to the predetermined threshold value (Step S33). In a case where it is determined that Rth (j–c) is not greater than the threshold value (lower than or equal to the threshold value), the MOSFETs 81, 82 of the detection operation switching circuit 8 are turned ON in Step S34 so as to cause the overcurrent detecting circuit OC and the overvoltage detecting circuit VC to each perform the detection operations while preventing the gate voltage adjusting comparator 7 from performing the comparison operations. After that, the normal operations are maintained until the semiconductor device 200 stops (Step S35).

In a case where it is determined that Rth (j–c) is greater than the threshold value again in step S33, an error signal is output to the outside (Step S36). Further, the normal operations may be maintained until the semiconductor device 100 is stopped from the outside due to the error signal, or outputting the error signal may force the semiconductor device 100 to stop.

<First Modification>

The second embodiment described above shows the example of using ΔVCE (sat) to calculate the heat resistance of the lower portion of the power semiconductor element 21 for the determination of whether or not the solder melting process is needed, and ΔVGE described below may also be used.

ΔVGE is a technique for calculating a heat resistance of a lower surface of a semiconductor element from a difference in gate voltage before and after the semiconductor element is supplied with a constant collector current (whose value may select a collector current value during normal operations) for a predetermined period of time when a current flows through the semiconductor element.

First, the temperature detecting diode TD1 measures a change in temperature of the element while a gate voltage is adjusted such that a constant collector current flows through the power semiconductor element 21 in advance, and a change in the gate voltage in relation to the change in temperature is recorded in the microcomputer 61 of the variable reference voltage circuit 6.

Figure 13:
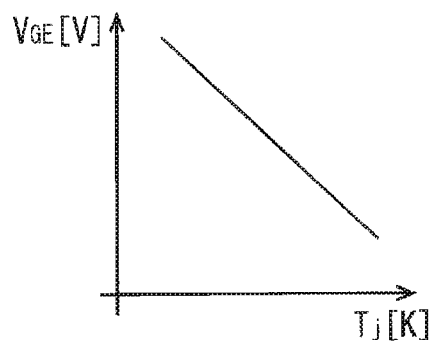
FIG. 13 is a diagram showing characteristics of a gate-emitter voltage in relation to a temperature change.

FIG. 13 shows an example of the temperature characteristics obtained in such manner. In FIG. 13, the horizontal axis indicates a temperature T (K), and the vertical axis indicates a gate-emitter voltage $V_{GE}$ (V). In FIG. 13, the gate-emitter voltage $V_{GE}$ decreases as the temperature increases.

Figure 14:
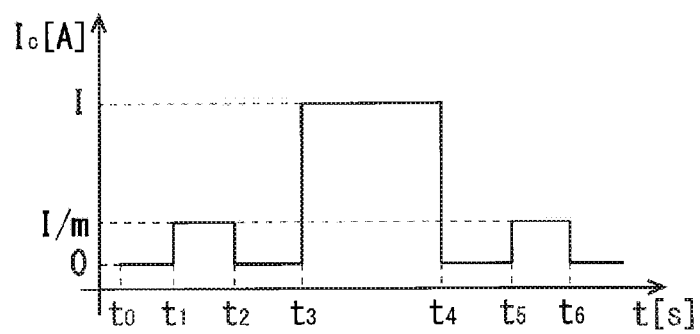
FIG. 14 is a diagram showing a timing chart of an adjustment to a gate voltage.

Next, the difference in the gate-emitter voltage before and after the constant collector current is supplied for the predetermined period time is determined. FIG. 14 shows a timing chart in which periods of times $t_0$ to $t_6$ are divided into periods of times to to $t_1$, times $t_1$ to $t_2$, times $t_2$ to $t_3$, times $t_3$ to $t_4$, times $t_4$ to $t_5$, and times $t_5$ to $t_6$, a gate voltage is adjusted such that a constant collector current I (whose value may be a collector current value flowing to obtain the characteristics in FIG. 13 and may be greater or lower than that) flows during the times $t_3$ to $t_4$, and, in contrast, a gate voltage is adjusted such that a current of I/m (in which m is a whole number) flows during the times $t_1$ to $t_2$ and the times $t_5$ to $t_6$.

The microcomputer 61 records respective gate-emitter voltages $V_{GE1}$, $V_{GE2}$ during the respective periods of the times $t_1$ to $t_2$ and the times $t_5$ to $t_6$ when the collector current of I/m flows according to the timing chart.

Figure 15:
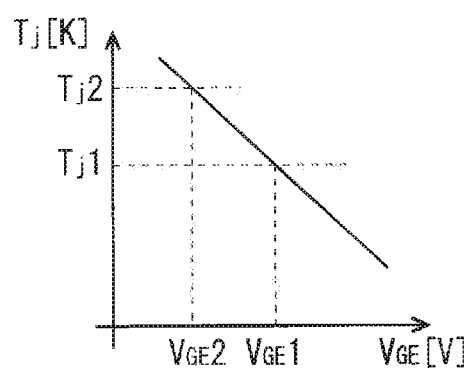
FIG. 15 is a diagram showing relationships among gate-emitter voltages and temperatures of a power semiconductor element.

Then, a temperature $T_j1$ and a temperature $T_j2$ of the power semiconductor element 21 respectively corresponding to the gate-emitter voltage $V_{GE1}$ and the gate-emitter voltage $V_{GE2}$ that have been obtained are determined from the temperature characteristics shown in FIG. 13, and a temperature difference $T_j2-T_j1$ caused by passing the collector current I is calculated. FIG. 15 shows the relationships between the gate-emitter voltage $V_{GE1}$ and the temperature $T_j1$ and the gate-emitter voltage $V_{GE2}$ and the temperature $T_j2$ that have been determined in such manner. In FIG. 15, the horizontal axis indicates gate-emitter voltage, and the vertical axis indicates temperature of the power semiconductor element 21.

Moreover, the temperature detector TD2 disposed on the main surface of the base plate 16 measures temperature of the package case 20 to obtain a case temperature $T_c1$ in the time $t_2$ and a case temperature $T_c2$ in the time $t_6$, which are recorded in the microcomputer 61.

Then, the microcomputer 61 calculates the heat resistance of the lower portion of the power semiconductor element 21 from expression (1) described above based on information of the temperatures and $T_j2$ of the power semiconductor element 21, the temperatures $T_c1$ and $T_c2$ of the package case 20, the collector current I, the collector-emitter voltage $V_{CE}$ when the collector current I flows, and a period $(t_4-t_3)$ in which the collector current I flows.

As described above, the heat resistance of the lower portion of the power semiconductor element 21 is calculated using ΔVGE, allowing an accurate determination of whether or not the solder melting process is needed.

<Second Modification>

In the second embodiment described above, the configuration of calculating the heat resistance of the lower portion of the power semiconductor element 21 for the determination of whether or not the solder melting process is needed is described. More simply, whether or not the solder melting process is needed may be determined on the basis of a temperature of the upper surface of the power semiconductor element 21 by the temperature detecting diode TD1 disposed on the upper surface of the power semiconductor element 21.

The temperature detecting diode TD1 is disposed on the upper surface of the power semiconductor element 21, so that the temperature detecting diode TD1 has a value extremely close to the temperature of the lower portion of the power semiconductor element 21 and has sufficient accuracy for determining whether or not the solder melting process is needed.

This also eliminates the need for disposing the temperature detector TD2 on the main surface of the base plate 16, resulting in the advantage of further simplifying the configuration of the device.

Moreover, the temperature detecting diode TD1 may include a plurality of temperature detecting diodes TD1 to increase detection accuracy.

FIG. 16 shows an example of the temperature detecting diodes TD1 provided in four corners of the upper surface of the power semiconductor element 21.

In other words, cracks in the below-semiconductor-element solder layer 31 easily occur in the four corners when the power semiconductor element 21 has a rectangular shape in plan view, so that detecting temperatures of the four corners of the power semiconductor element 21 can more accurately determine the life of the power semiconductor element 21.

In this case, while a predetermined collector current flows through the power semiconductor element 21, temperature information from each of the temperature detecting diodes TD1 in the four corners is given to the microcomputer 61 of the variable reference voltage circuit 6. When the temperature information indicating the highest temperature is greater than a predetermined threshold value, the solder melting process may start.

Alternatively, an average value of a plurality of pieces of temperature information is calculated, and when the average value is greater than the predetermined threshold value, the solder melting process may start.

The temperature detection diodes TD1 may be provided in two corners located diagonally to each other or two corners located in parallel to each other instead of the four corners.

Third Embodiment

The first embodiment and the second embodiment for the semiconductor device of the present invention described above show the example of detecting an emitter current with the current detecting resistor 4 connected between the current detecting emitter and the ground line N of the power semiconductor element 21, and may also adopt a configuration of a variable gate voltage circuit 90B shown in FIG. 17. In FIG. 17, the same components as those of the variable gate voltage circuit 90 described with reference to FIG. 5 are denoted by the same references, and redundant descriptions are omitted.

As shown in FIG. 17, a shunt resistor SR connected between the emitter and the ground line N of the power semiconductor element 21 directly detects an emitter current (almost equal to a collector current).

The gate voltage adjusting comparator 7 may receive the emitter current value as the collector current value from the inverting input (−) and may compare the emitter current to the output of the variable reference voltage circuit 6, thereby adjusting a gate voltage to set the collector current to a target value.

An output of the emitter, which is exceedingly greater than the output of the current detecting emitter, has the advantages of being hardly influenced by noise or the like and of obtaining an accurate emitter current.

Fourth Embodiment

In the first to third embodiments described above, the technique of self-repairing cracks in the below-semiconductor-element solder layer 31 by adjusting the gate voltage to melt the below-semiconductor-element solder layer 31 is described. A configuration shown in FIG. 18 may be used to prevent melted solder from overflowing from the conductive plate 28 of the insulating substrate 29 and dripping to reach the insulating base material 26 when the below-semiconductor-element solder layer 31 is melted.

Figure 18:
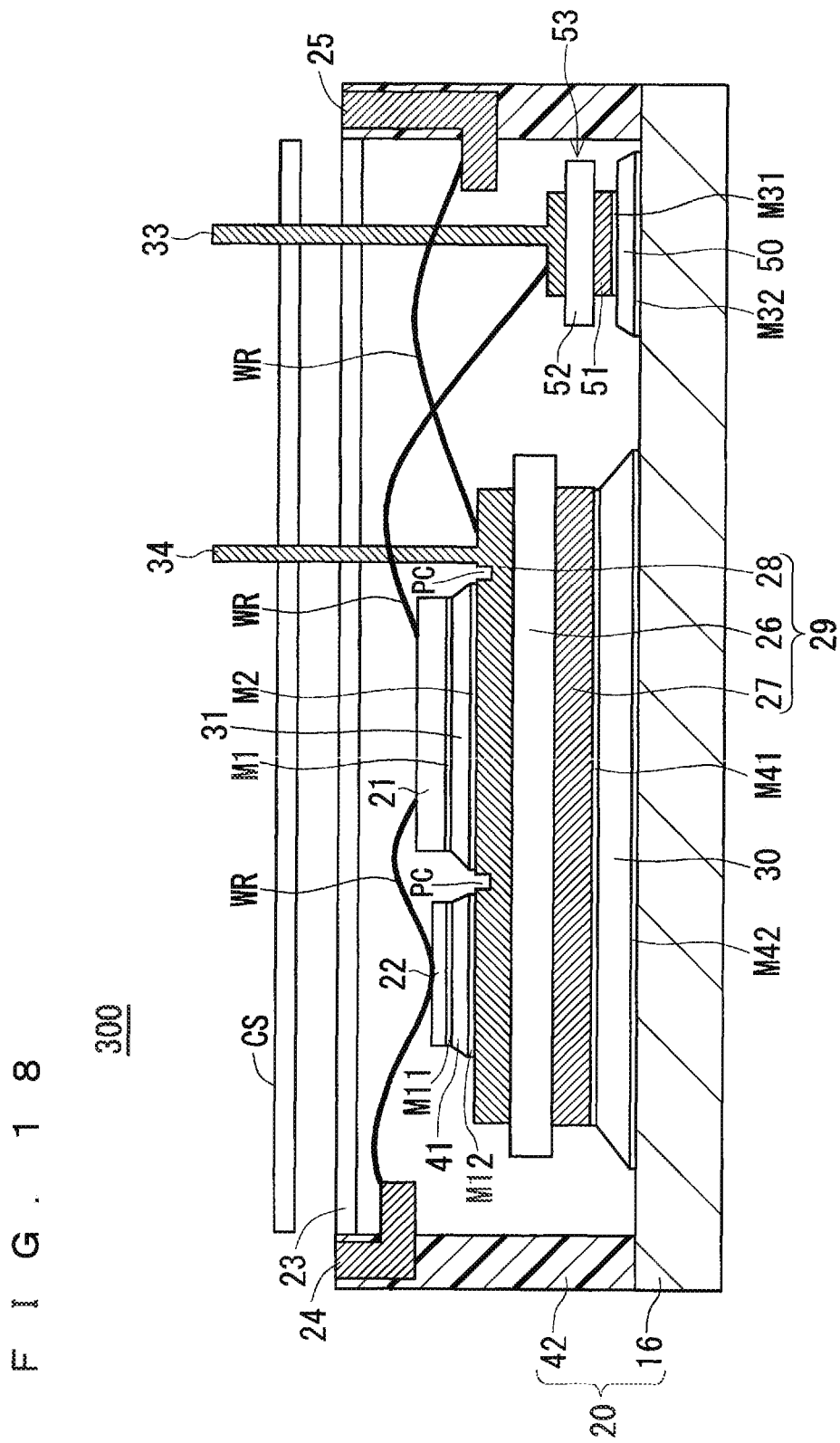
FIG. 18 is a cross-sectional view showing a configuration of a semiconductor device in a fourth embodiment of the present invention.

In other words, a pocket PC having a groove shape may be provided in the main surface of the conductive plate 28 similarly to a semiconductor device 300 shown in FIG. 18. FIG. 19 is a plan view showing the insulating substrate 29 when seen from the control substrate CS side, and the pocket PC is provided so as to surround the power semiconductor element 21.

The pocket PC stops the flow of solder, which flows in the pocket PC, when the below-semiconductor-element solder layer 31 is melted, to thereby prevent the solder from overflowing from the conductive plate 28 and prevent the solder from dripping. The pocket PC can be formed by etching the conductive plate 28, and the pocket PC has a depth and a width set in consideration of the volume of the below-semiconductor-element solder layer 31.

Fifth Embodiment

In the first to third embodiments described above, the technique of self-repairing cracks in the below-semiconductor-element solder layer 31 by adjusting the gate voltage to melt the below-semiconductor-element solder layer 31 is described. A configuration shown in FIG. 20 may be used to prevent melted solder from overflowing from the conductive plate 28 of the insulating substrate 29 and dripping to reach the insulating base material 26 when the below-semiconductor-element solder layer 31 is melted.

Figure 20:
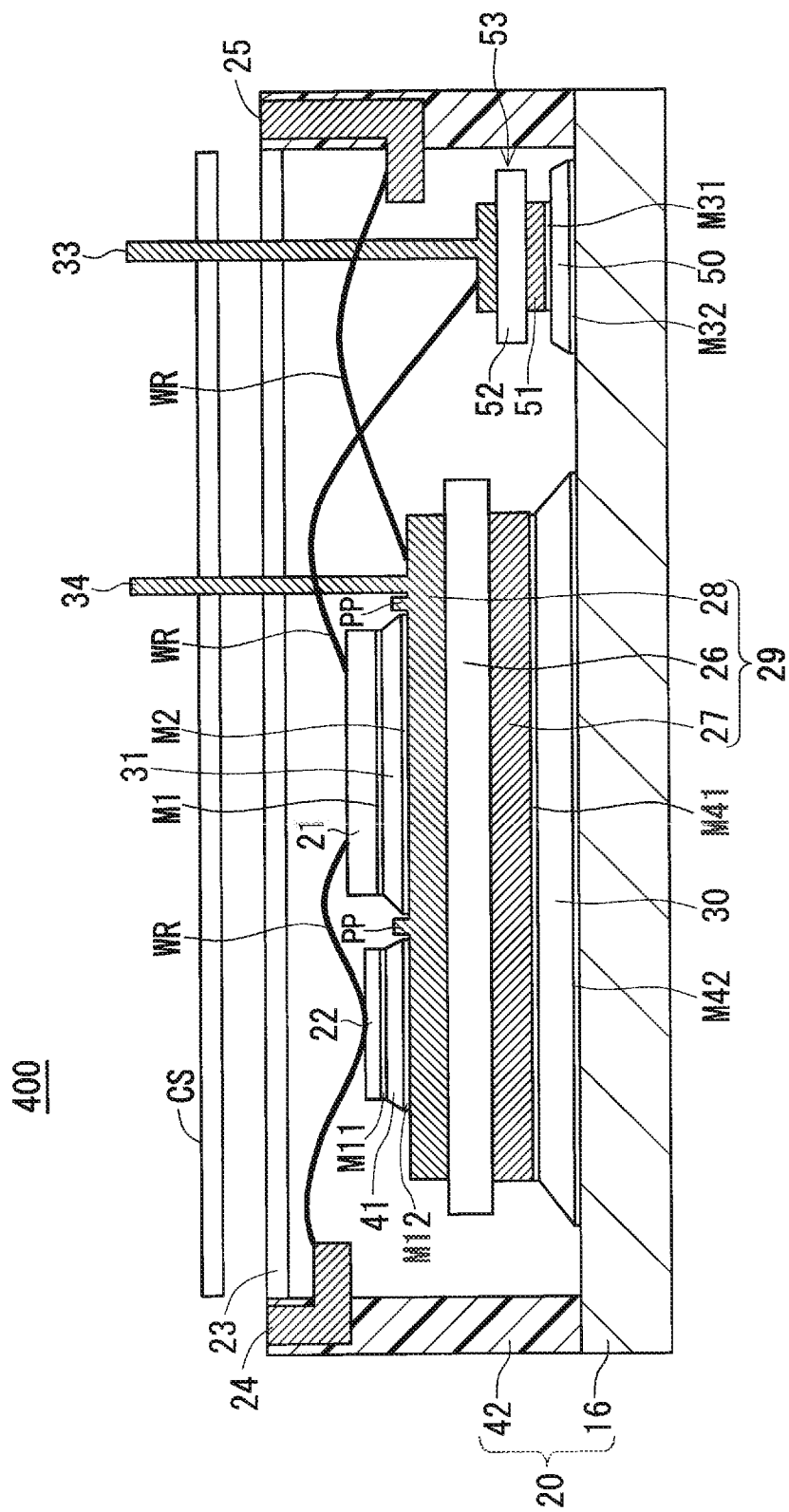
FIG. 20 is a cross-sectional view showing a configuration of a semiconductor device in a fifth embodiment of the present invention.
Figure 21:
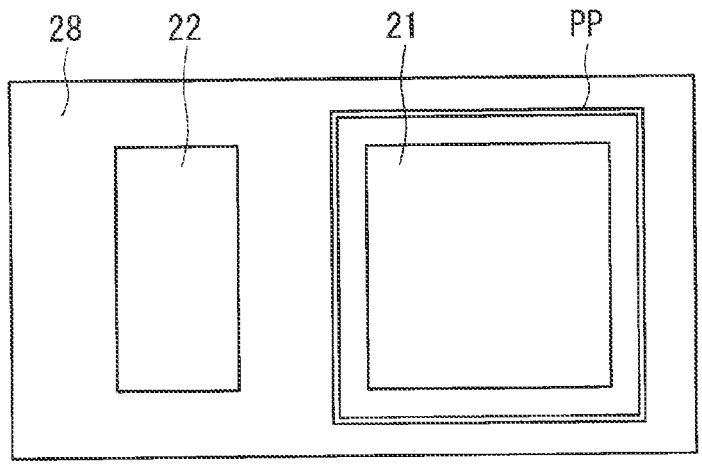
FIG. 21 is a plan view showing the configuration of the semiconductor device in the fifth embodiment of the present invention.

In other words, a protrusion PP having a wall shape may be provided on the main surface of the conductive plate 28 similarly to a semiconductor device 400 shown in FIG. 20. FIG. 21 is a plan view showing the insulating substrate 29 when seen from the control substrate CS side, and the protrusion PP is provided so as to surround the power semiconductor element 21.

The protrusion PP stops the flow of solder when the below-semiconductor-element solder layer 31 is melted, to thereby prevent the solder from overflowing from the conductive plate 28 and prevent the solder from dripping. The protrusion PP can be formed by etching the conductive plate 28 except for a region of the protrusion PP, and the protrusion PP has a height set in consideration of the volume of the below-semiconductor-element solder layer 31.

Sixth Embodiment

In the first embodiment described above, the configuration of the semiconductor device of the wire bonding module type in which the below-semiconductor-element solder layer 31 is melted is described and is also applicable to a direct lead bonding (DLB) semiconductor device shown in FIG. 22.

Figure 22:
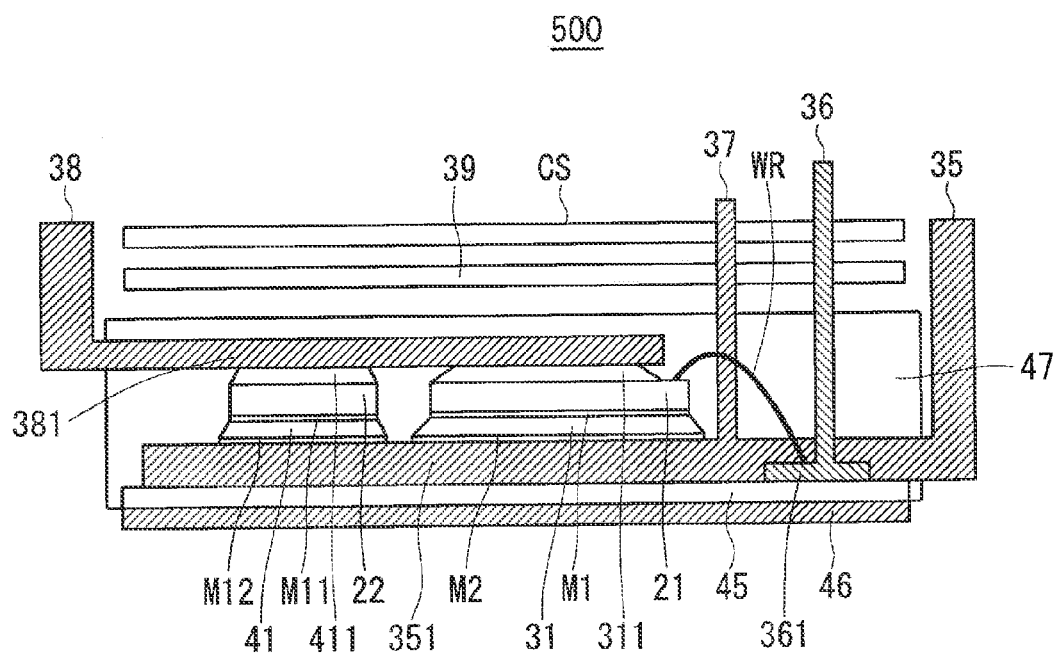
FIG. 22 is a cross-sectional view showing the configuration of the semiconductor device in the sixth embodiment of the present invention.

FIG. 22 is a cross-sectional view showing a configuration of a semiconductor device 500 in a sixth embodiment of the present invention. In FIG. 22, a power semiconductor element 21 and a power semiconductor element 22 are respectively bonded to a main surface of a heat spreader 351 with a below-semiconductor-element solder layer 31 and a below-semiconductor-element solder layer 41 therebetween, the heat spreader 351 being formed of a copper (Cu) material, an aluminum (Al) material, or an alloy material containing Cu as a main component. More specifically, a conductive pattern M2 disposed on the upper main surface of the heat spreader 351 is bonded to a conductive pattern M1 disposed on a lower main surface of the power semiconductor element 21 with the below-semiconductor-element solder layer 31 therebetween, and a conductive pattern M12 disposed on the upper main surface of the heat spreader 351 is bonded to a conductive pattern M11 disposed on a lower main surface of the power semiconductor element 22 with the below-semiconductor-element solder layer 41 therebetween.

The heat spreader 351 has part of an end portion on a side on which the power semiconductor element 21 is mounted, the part of the end portion being bent into an L-shape, extending upwardly, and functioning as a main electrode terminal 35 (P-side main electrode terminal).

The power semiconductor element 21 and the power semiconductor element 22 respectively have upper surfaces bonded to a lower main surface of a main electrode terminal plate 381 with an above-semiconductor-element solder layer 311 and an above-semiconductor element solder layer 411 therebetween.

The main electrode terminal plate 381 has an end portion on a side on which the power semiconductor element 22 is mounted, the end portion being bent into an L-shape, extending upwardly, and functioning as a main electrode terminal 38 (N-side main electrode terminal).

Further, a collector-emitter voltage output terminal 37 that extends vertically to the main surface of the heat spreader 351 is provided on the main surface thereof.

The heat spreader 351 is mounted on an insulating sheet 45 formed of an insulating material of silicone rubber or the like. A control terminal plate 361 provided separately from the heat spreader 351 is mounted on the insulating sheet 45. A gate electrode of the power semiconductor element 21 is electrically connected to the control terminal plate 361 with an internal metal wire WR. A control terminal 36 is provided on the main surface of the control terminal plate 361. A copper foil 46 is bonded to a lower main surface of the insulating sheet 45.

The configuration from the insulating sheet 45 to the main electrode terminal plate 381 described above is sealed with resin and forms a resin module 47 having a box shape. The main electrode terminal 35 and the main electrode terminal 38 protrude from side surfaces of the resin module 47 opposed to each other and extend upwardly along each of the side surfaces.

An upper portion of the resin module 47 is covered with a noise shielding plate 39 formed of a metal plate of Al, Cu, or the like, and a control substrate CS is disposed on the noise shielding plate 39.

The control terminal 36 and the collector-emitter voltage output terminal 37 penetrate the noise shielding plate 39 and the control substrate CS and are each electrically connected to predetermined portions of a control circuit (not shown) mounted on the control substrate CS.

<Application of Semiconductor Element>

The first to sixth embodiments described above do not particularly limit types of semiconductors of the power semiconductor element 21. The power semiconductor element 21 is not limited to a silicon semiconductor including a silicon (Si) substrate as a semiconductor substrate, and may be a silicon carbide semiconductor including a silicon carbide (SiC) substrate as a semiconductor substrate or may be another semiconductor with a wide band gap including a substrate formed of, for example, a gallium nitride-based material or diamond.

Switching elements and diode elements formed of such wide band gap semiconductors have high withstand voltage and allowable current of high density, allowing size reduction compared to silicon semiconductors. Semiconductor device modules including built-in elements that are the miniaturized switching elements and the miniaturized diode elements can be reduced in size. The semiconductor device modules have high resistance and allow the use of solder having a high melting point.

While the invention has been shown and described in detail, the foregoing description is in all aspects illustrative and not restrictive. The present invention is not restricted thereto. It is therefore understood the numerous modifications and variations can be devised without departing from the scope of the invention.

In addition, according to the present invention, the above embodiments can be arbitrarily combined, or each embodiment can be appropriately varied or omitted within the scope of the invention.

The invention claimed is:

1. A semiconductor device, comprising:
   a base plate;
   an insulating substrate mounted on said base plate;
   a power switching element bonded to said insulating substrate with a solder layer; and
   said base plate, said insulating substrate, and said power switching element forming a module,
   a control substrate located above said module,
   wherein said control substrate includes a variable gate voltage circuit measuring a collector-emitter voltage of said power switching element and changing a gate voltage such that said power switching element is supplied with given target power determined by a product of said collector-emitter voltage and a collector current.

2. The semiconductor device according to claim 1, wherein said variable gate voltage circuit adjusts said gate voltage such that power for melting said solder layer is supplied as said given target power.

3. The semiconductor device according to claim 2, wherein
   said module further includes at least one temperature detecting element disposed on an upper surface of said power switching element, and
   said variable gate voltage circuit includes a microcomputer configured to adjust said gate voltage such that said power switching element is supplied with said given target power in a case where an upper-surface temperature of said power switching element during normal operations detected by said at least one temperature detecting element is compared to a predetermined threshold value, and said upper-surface temperature is greater than said threshold value.

4. The semiconductor device according to claim 3, wherein
said power switching element has a rectangular shape in a plan view, and
said at least one temperature detecting element is disposed on each of four corners of the upper surface of said power switching element.

5. The semiconductor device according to claim 2, wherein
said module further includes:
a first temperature detecting element disposed on an upper surface of said power switching element; and
a second temperature detecting element disposed on a main surface of said base plate in said module, and
said variable gate voltage circuit includes a microcomputer configured to:
adjust a gate voltage such that a constant collector current flows through the power switching element while said first temperature detecting element measures an upper-surface temperature of said power switching element, and obtain collector-emitter voltage characteristics in relation to a temperature change,
respectively obtain a first collector-emitter voltage and a second collector-emitter voltage by passing, during a first period before passing a first collector current and during a second period after passing said constant collector current, a second current being 1/m (in which m is a whole number) of said first collector current,
calculate, from said collector-emitter voltage characteristics, a first upper-surface temperature and a second upper-surface temperature of said power switching element respectively corresponding to said first collector-emitter voltage and said second collector-emitter voltage,
obtain, using said second temperature detecting element, a first base-plate temperature and a second base-plate temperature respectively being a temperature of said base plate in said first period and a temperature of said base plate in said second period,
calculate a heat resistance of a lower portion of said power switching element from expression (1) based on information of said first and second upper-surface temperatures, said first and second base-plate temperatures, said first collector current, a collector-emitter voltage when said first collector current flows, and a third period in which said first collector current is supplied $$\text{Heat Resistance [K/W]} = \frac{(T_j2 - T_j1) - (T_c2 - T_c1)}{I \times V_{CE} \times (t_4 - t_3)} \quad (1)$$

where I represents a first collector current, VCE represents a collector-emitter voltage, $T_j1$ represents a first upper-surface temperature, $T_j2$ represents a second upper-surface temperature, $T_c1$ represents a first base-plate temperature, $T_c2$ represents a second base-plate temperature, and $t_4-t_3$ represents a third period, and adjust said gate voltage such that said power switching element is supplied with said given target power in a case where said heat resistance is compared to a predetermined threshold value, and said heat resistance is greater than said threshold value.

6. The semiconductor device according to claim 2, wherein
said module further includes:
a first temperature detecting element disposed on an upper surface of said power switching element; and
a second temperature detecting element disposed on a main surface of said base plate in said module, and
said variable gate voltage circuit includes a microcomputer configured to:
adjust a gate voltage such that a constant collector current flows through the power switching element while said first temperature detecting element measures an upper-surface temperature of said power switching element, and obtain gate emitter voltage characteristics in relation to a temperature change,
respectively obtain a first gate-emitter voltage and a second gate-emitter voltage by passing, during a first period before passing a first collector current and during a second period after passing said constant collector current, a second current being 1/m (in which m is a whole number) of said first collector current,
calculate, from said gate emitter voltage characteristics, a first upper-surface temperature and a second upper-surface temperature of said power switching element respectively corresponding to said first gate-emitter voltage and said second gate-emitter voltage,
obtain, using said second temperature detecting element, a first base-plate temperature and a second base-plate temperature respectively being a temperature of said base plate in said first period and a temperature of said base plate in said second period,
calculate a heat resistance of a lower portion of said power switching element from expression (2) based on information of said first and second upper-surface temperatures, said first and second base-plate temperatures, said first collector current, a collector-emitter voltage when said first collector current flows, and a third period in which said first collector current is supplied $$\text{Heat Resistance [K/W]} = \frac{(T_j2 - T_j1) - (T_c2 - T_c1)}{I \times V_{CE} \times (t_4 - t_3)} \quad (2)$$

where I represents a first collector current, $V_{CE}$ represents a collector-emitter voltage, $T_j1$ represents a first upper-surface temperature, $T_j2$ represents a second upper-surface temperature, $T_c1$ represents a first base-plate temperature, $T_c2$ represents a second base-plate temperature, and $t_4-t_3$ represents a third period, and adjust said gate voltage such that said power switching element is supplied with said given target power in a case where said heat resistance is compared to a predetermined threshold value, and said heat resistance is greater than said threshold value.

7. The semiconductor device according to claim 2, wherein
said insulating substrate includes a conductive plate disposed on an insulating base material, said power switching element is bonded to said conductive plate with said solder layer, and said insulating substrate further includes a pocket having a groove shape in a main surface of said conductive plate, said pocket being provided so as to surround said power switching element.

8. The semiconductor device according to claim 2, wherein said insulating substrate includes a conductive plate disposed on an insulating base material, said power switching element is bonded to said conductive plate with said solder layer, and said insulating substrate further includes a protrusion having a wall shape on a main surface of said conductive plate, said protrusion being provided so as to surround said power switching element.

9. The semiconductor device according to claim 1, wherein said power switching element comprises a wide band gap switching element formed on a wide band gap semiconductor substrate.

* * * * *